United States Patent [19]

Joslin et al.

[11] Patent Number: 4,906,596

[45] Date of Patent: Mar. 6, 1990

[54] DIE ATTACH ADHESIVE COMPOSITION

[75] Inventors: Sara T. Joslin, Cherry Hill, N.J.; Christine M. Rosell, Newark; Jerome D. Smith, Wilmington, both of Del.

[73] Assignee: E. I. Du Pont de Nemours & Co., Wilmington, Del.

[21] Appl. No.: 383,331

[22] Filed: Jul. 20, 1989

Related U.S. Application Data

[63] Continuation-in-part of Ser. No. 253,824, Oct. 6, 1988, abandoned, which is a continuation-in-part of Ser. No. 122,628, Nov. 25, 1987, abandoned, which is a continuation-in-part of Ser. No. 938,227, Dec. 5, 1986, abandoned.

[51] Int. Cl.$^4$ .................................................. C03C 8/00
[52] U.S. Cl. ........................................ 501/17; 501/19; 501/20; 501/22; 252/514; 106/1.13; 106/1.14
[58] Field of Search ................ 501/15, 19, 17, 20, 501/32; 252/514; 106/1.13, 1.14

[56] References Cited

U.S. PATENT DOCUMENTS

| | | | |
|---|---|---|---|
| 2,461,878 | 2/1949 | Christensen et al. | 310/9.7 |
| 2,530,217 | 11/1950 | Bain | 106/49 |
| 3,497,774 | 2/1970 | Hornberger et al. | 317/101 |
| 3,640,764 | 2/1972 | Shevlin | 117/212 |
| 3,759,727 | 9/1973 | Dietz et al. | 106/49 |
| 3,787,218 | 1/1974 | Dietz et al. | 106/39.5 |
| 3,963,505 | 6/1976 | Dumesnil et al. | 106/47 R |
| 3,975,201 | 8/1976 | Greenstein | 106/48 |
| 4,002,799 | 1/1977 | Dumesnil et al. | 428/428 |
| 4,401,767 | 8/1983 | Dietz et al. | 501/19 |
| 4,436,785 | 3/1984 | Dietz et al. | 428/427 |
| 4,446,059 | 5/1984 | Eustice | 106/1.13 |
| 4,459,166 | 7/1984 | Dietz et al. | 156/89 |
| 4,610,929 | 9/1986 | Mosser et al. | 428/421 |
| 4,636,254 | 1/1987 | Husson, Jr. et al. | 106/1.14 |

FOREIGN PATENT DOCUMENTS

| | | |
|---|---|---|
| 215462 | 9/1986 | European Pat. Off. . |
| 58-73904 | 12/1983 | Japan . |
| 2103250 | 2/1983 | United Kingdom . |

*Primary Examiner*—Brian E. Hearn
*Assistant Examiner*—Andrew Griffis

[57] ABSTRACT

A composition which is useful for bonding integrated circuits to inorganic dielectric substrates comprising an admixture of finely divided particles of a thermally conductive metal or metal-containing compound, non-aqueously milled amorphous glass frit and fatty acid-based surfactant dispersed, in a solution of primary organic solvent selected from ethylene glycol monobutyl ether acetate, dimethyl adipate and mixtures thereof and optionally minor amounts of certain secondary solvents and an acrylic polymer which is free of polar functional groups.

15 Claims, 1 Drawing Sheet

DIE ATTACH ADHESIVE COMPOSITION

CROSS-REFERENCE TO RELATED APPLICATIONS

This application is a continuation-in-part of copending U.S. patent application Ser. No. 07/253,824 filed Oct. 6, 1988, now abandoned, which is a continuation-in-part of U.S. patent application Ser. No. 122,628 filed Nov. 25, 1987, now abandoned which is a continuation-in-part of U.S. application Ser. No. 938,227, filed Dec. 5, 1986 and now abandoned.

FIELD OF INVENTION

The invention is directed to an adhesive composition having improved rheology for attaching integrated circuit devices to substrates.

BACKGROUND OF THE INVENTION

Historically, military and other high-reliability devices have been hermetically packaged in ceramic parts. A gold-silicon eutectic bonding process has been used to bond the integrated circuit (IC) to the header (ceramic substrate) to avoid entrapped and evolved moisture and other gasses typically experienced when using silver-filled organic polymers in plastic packages.

The primary reasons for developing an alternative to gold-eutectic are the need for lower cost processing, faster processing, less stress transmissions to the IC as larger chips are designed, and improved heat transfer.

To meet these needs, the most suitable approach now recognized is a conductive metal-filled glass system that contains no organic material after processing. Silver is the metal of choice because of industry acceptance in epoxy systems typically used in plastic packages. Silver has the necessary properties and is available in suitable flake size and purity.

The silver-glass matrix provides a more void-free bonding layer than the gold-silicon eutectic system. Thus, although the thermal conductivity of gold is greater than that of the silver-glass, the absence of voids in the matrix provides greater heat transfer.

As ICs become larger, they are more susceptible to cracking due to stress induced by mismatched thermal coefficients of expansion (TCE) with the package. The silver-glass matrix transmits less stress to the IC than the gold-silicon layer.

SUMMARY OF THE INVENTION

In its primary aspect, the invention is directed to a composition which is useful for bonding integrated circuits to inorganic dielectric substrates comprising an admixture of:

a. finely divided particles of metal and/or metal-containing compound having a thermal conductivity of at least 0.2 Wcm$^{-1}$K$^{-1}$ at 298 K at least 90% of the metal particles having a maximum dimension of less than 15 μm;

b. finely divided particles of a non-aqueously milled crystallizable amorphous glass frit which (1) has a DTA softening point of 300°–400° C., (2) has a contact angle with gold of no more than 60° when measured at a peak temperature of 400° C., and (3) is substantially free of alkali metal and halogen ions, the volume ratio of a. to b. being from 0.75 to 5.0;

c. 0.2–2% weight of a surfactant selected from long chain carboxylic acids, alkyl esters of long chain carboxylic acids, and mixtures thereof, a., b., and c. being dispersed in d. organic medium comprising a solution of
  (1) acrylic polymer free of polar functional groups dissolved in
  (2) a solvent consisting essentially of (a) 60–100% wt. of a primary solvent selected from ethylene glycol monobutyl ether acetate, dimethyl adipate and mixtures thereof and (b) 40–0% wt. of a secondary solvent selected from glycol monoethers, terpineol, 2,2,4-trimethyl-1,2-pentanediol monoisobutyrate, tridecyl acetate and mixtures thereof, the total composition containing 0.5–5% wt. acrylic polymer, the composition having a yield stress of at least 200 dynes/cm.

In a secondary aspect, the invention is directed to an electronic assemblage comprising a ceramic substrate having a semiconductor chip bonded thereto by a layer of the above-described composition, which has been fired to effect volatilization of the organic medium therefrom and liquid phase or viscous sintering of the glass frit.

In a preferred embodiment of both aspects of the invention, the amorphous glass frit is a crystallizing glass, i.e., a glass which forms a crystalline phase during the firing process. In particular, the glass should form a crystalline phase when fired at 350°–500° C. The crystallizing phase can be either of same or different composition as the glass matrix in which it is dispersed (remainder glass).

PRIOR ART

U.S. Pat. No. 3,497,774, Hornberger et al.

The reference is directed to the use of a metalfilled glass paste to bond a semiconductor chip to a substrate which is coated with a conductive layer. U.S. Pat. Nos. 4,401,767, 4,436,785 and 4,459,166, Dietz et al.

These three patents are directed to the use of silver-filled glass pastes to bond conductor chips to the ceramic substrates. The paste consists of (a) 25 to 95% of silver powder having a surface area of about 0.2 to 1.0 m$^2$/gm and a tap density of about 2.2 to 2.8 gm/cc; (b) 75 to 5% of a high-lead, borosilicate substantially sodium-free glass frit having a softening temperature in the range of 325° to 425° C., a coefficient of thermal expansion no higher than about 13 ppm/C, a surface area in the range of about 0.3 to 0.6 m$^2$/gm, and a tap density in the range of about 2.8 to 3.6 gm/cc, and (c) a suitable liquid organic vehicle in an amount sufficient to establish the percent solids in said paste in the range of about 75 to 85%. U.S. Pat. Nos. 3,759,727 and 3,787,218, Dietz et al.

These patents are directed to the use of a lead zinc borate glass containing zircon particles as a bonding agent for ceramic substrates. U.S. Pat. Nos. 3,963,505 and 4,002,799, Dumesnil et al.

The patents are directed to sealing glass compositions which are either lead boron glasses or lead zinc boron glasses in which the ZnO/PbO mol ratio is 0.5 or less, and a non-inert ZnO-containing material, e.g., zinc silicate or chromate.

Japanese Pat. Appln. 57-132939, Tates et al.

In its broadest aspect the patent discloses a die attach adhesive comprising finely divided particles of silver metal, low melting glass frit and an organic medium which is a solution of methyl methacrylate in terpineol. The only frit disclosed is a high lead (95–96% wt.)

borosilicate glass having a softening point of 325°–425° C. and a TCE of below 13 ppm/C.

DETAILED DESCRIPTION OF THE INVENTION

A. Metal and/or Metal-Containing Compound

Figure 1:
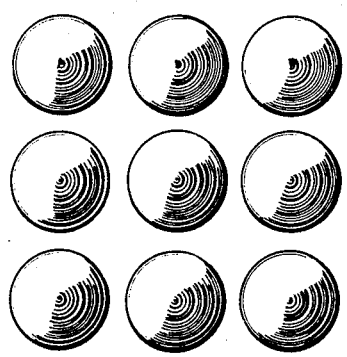
FIG. 1 is a pictorial elevation view of a bonding composition dispense test pattern using a conventional terpineol solvent system as organic medium.

A wide variety of metals and/or metal-containing compounds can be used in the composition of the invention so long as they have sufficient thermal conductivity of at least 0.2 $Wcm^{-1}K^{-1}$ and preferably at least 0.4 $Wcm^{-1}K^{-1}$ at 298 K. This degree of thermal conductivity is required of this component in order that the fired composition be capable of transmitting sufficient heat from the semiconductor chip.

Suitable thermal conductive metals include silver, gold, palladium, platinum, nickel and alloys of palladium and silver. Gold and silver are preferred conductive metals, of which silver in flake morphology is preferred.

Suitable thermal conductive metal-containing materials include alumina, beryllia, aluminum nitride, silicon carbide, molybdenum silicide, molybdenum oxide and ruthenium oxides such as $RuO_2$ and ruthenium-containing pyrochlores.

Particle size of the thermally conductive metal component of the invention has been found to be unexpectedly critical. In particular it is essential that at least 90% wt. of the particles have a maximum dimension of below 15 $\mu$m in order to ensure adequate adhesion of the composition. Particularly preferred particle sizes are 0.5–12 microns. In the case of silver, which is the preferred conductor material for use in the invention, flake configuration is preferred since the rheology of the composition made therefrom is improved. In particular, the dispersions are more stable. Typical preferred flake silver configurations have the following particle size distribution (1)

90% less than 8–10 microns diameter
50% less than 3.5–4.5 microns diameter
10% less than 1–1.2 microns diameter. (1) Size distribution was measured on either isopropanol or water dispersions using a Microtrac ® particle size analyzer made by Leeds & Northrup Co., St. Petersburg, FL.

Because silicon semiconductor devices are susceptible to corrosion and physical changes arising from mobile ionic species, both the metal and metalcontaining compound and the glass frit must be substantially free of extractable ionics such as $Na^+$, $K^+$, $NH_4^+$ and halide ions. Thus, neither the metal/metal-containing compound nor the glass frit should contain more than 15 ppm by weight and preferably no more than 10 ppm of such extractable ionic species. The total of such ionic extractables from both the frit and the metal or metal-containing compound should not exceed 20 ppm and preferably should not exceed 10 ppm.

As discussed in section C. hereinbelow, the metal or metal-containing component of the paste of the invention may have a coating of surfactant. Commercially available flaked silver particles are generally coated with such surfactants, in which case it is not necessary to add surfactant to the organic medium.

B. Glass Frit

The glass frits which can be used in the invention are amorphous glasses which can be either crystallizing (devitrifying) or noncrystallizing (vitreous). However, glass frits which form a crystalline phase during firing at 350°–500° C. are preferred. In addition, as mentioned above, it is also essential that the glass be substantially free of extractable ions such as halide, ammonium and alkali metal ions.

As used herein the term "crystallizable" and "crystallizing" refer to the fact that at least one crystalline phase is formed when the amorphous glass frit is fired at 350° to 500° C.

Preferred glasses for use in the invention are zinc lead borate or zinc lead borosilicate glasses such as the following, the compositions of which are given in % wt.:

| Glass Dispersion | A | B | C | D |
|---|---|---|---|---|
| ZnO | 10.4 | 10.4 | 7 | 17.4 |
| PbO | 78.5 | 78.5 | 82 | 70.3 |
| $B_2O_3$ | 11.1 | 7.1 | 7 | 12.3 |
| $SiO_2$ | — | 4.0 | 4 | — |
| Crystallization | Yes | No | No | Yes |

Lead borate and lead borosilicate glasses can also be used in the invention provided they meet the above-described criteria with respect to DTA softening point, wettability on gold and freedom from halogen and alkali metal ions.

It is preferred that the glass frit particles have a surface area of 0.5–2.5 $m^2/g$ and it is particularly preferred that the surface area be in the range of 0.6–1.2 $m^2/g$.

While small amounts of $SiO_2$ up to 5% can be used in the glass component, it is preferred that the glass contain no $SiO_2$ at all and, in the case of the crystallizable glasses, it is essential that they contain no substantial amount of $SiO_2$, i.e., no more than about 2 or 3% wt.

The glasses of this invention are prepared with conventional glassmaking techniques by mixing the desired components in the desired proportions and heating the mixture to form a melt. As is well known in the art, heating is conducted to a peak temperature and for time such that the melt becomes entirely liquid and homogeneous. In the present work, the components were premixed by shaking vigorously in a polyethylene jar and then melted in either platinum or high purity alumina crucibles at the desired temperature. The melt was heated at a peak temperature of 800°–1000° C. for a period of 0.5 to 1 hour and then poured into cold deionized water. The maximum temperature of the water during quenching is kept low by increasing the water-melt volumetric ratio. After separation from water, the crude frit is freed from residual water by drying in air or by displacing the water with either methanol or acetone.

The crude frit is then ball milled using a non-aqueous suspending fluid. A preferred milling method is to ball mill the crude frit for 4–16 hours in high purity alumina containers using either high purity alumina or zirconia balls and a nonaqueous suspending liquid such as isopropanol. Residual alumina or zirconia picked up by the materials, if any, is not within the observable limit as measured by x-ray diffraction analysis. After discharging the milled frit slurry from the mill, large particles are removed by screening the slurry through a 100-mesh screen (U.S. Standard). The suspending liquid is then removed by drying the frit powder in an oven at 100°–160° C.

A still further preferred method for milling the crude frit is by the use of a fluidized bed jet mill in which the glass particles are impinged upon each other to obtain size reduction. The milled particles are then collected in cyclone separators. Such non-aqueous milling methods are preferred for the reason that the stability of the pastes formed from the glass frits is greater. In addition, jet milling gives much narrower particle size distribution, including less fines.

The preferred particle size distribution for glass frits to be used in the invention is as follows:

| 0.5 | $d_{10}$ | 1.3 microns |
|-----|----------|-------------|
| 2.0 | $d_{50}$ | 5.0 microns |
| 4.0 | $d_{90}$ | 10.0 microns |

(Measured by a Microtrac ® particle size analyzer with the frit dispersed in isopropyl alcohol containing tridecyl phosphate)

The above-referred particle size distribution for the glass frit has been found to be effective with respect to obtaining a good balance of dispersability and sintering properties.

When glass frit is used as the binder for die attach adhesives, an important property of the frit is to soften and sinter at the firing temperature and develop good adhesion with the thermally conductive phase (for example, silver), the silicon die (which may or may not have a thin layer of chemically deposited metallization), or the ceramic package. Additionally, the glass must display adequate cohesion to avoid failure of the attachment. The devitrification of the glass to give either a single crystalline phase having the same composition as the precursor noncrystalline (glassy) material or multiple crystalline phases with different composition from that of the precursor glassy material enhances the cohesive strength of glasses and in so doing can improve the strength of the bond between the silicon die and the ceramic package. To be effective in the invention, the glass should soften between 300° and 400° C. and may recrystallize between 350° and 500° C., depending on the firing cycle employed.

Because silicon semiconductor devices are susceptible to mobile ionic impurities (i.e., sodium, potassium, ammonium, and halide ions) in the die attach composition, the glass employed must be substantially free of these impurities.

Formation of voids between the silicon die and the ceramic package where the adhesive is for some reason absent can result in inadequate adhesion and thermal conductivity. The softening point of the glass should therefore be at a temperature above that where essentially all of the organic binder of the invention has been burned-out.

C. Surfactant

In order for the paste compositions of the invention to have suitable dispersion stability, it is preferred that they contain at least 0.2% wt. (basis total solids) of a fatty acid-based surfactant which is selected from long chain fatty acids and alcohols, amines or alkyl esters of such fatty acids. Mixtures of the various types of surfactants can be used as well.

Suitable fatty acids are the $C_{10-30}$ fatty acids such oleic acid, stearic acid, palmitic acid, linolenic acid, lauric acid, soybean fatty acids and coconut fatty acids. Fatty acids having 12–18 carbon atoms in their long hydrocarbon chain are preferred.

Suitable alkyl esters are those having 1–8 carbon atoms and preferably those having 2–6 carbon atoms.

It is important to have a small amount (equal to or greater than 0.2% wt., basis solids) of surfactant in the composition to obtain adequate dispersions stability. In this respect, higher amounts can therefore be used. However, to facilitate burn-out of the organic medium during firing, it is preferred to use no more than about 3% wt. and still more preferably no more than 2% wt. surfactant. In any event, the amount of surfactant as well as the organic medium should be minimized.

The surfactant can be dispersed in the composition either as a coating on the metal or metal containing component or in the organic medium. Somewhat smaller quantities of surfactant can be used with equal effectiveness when the surfactant is coated on the surface of the metal (as in the case of flake silver) or metal-containing compounds.

The use of surfactants in various aspects of the manufacture and use of particulate metals is disclosed in Hull et al. U.S. Pat. No. 2,002,891, Daiga, U.S. Pat. No. 3,768,994, Booz et al., U.S. Pat. No. 4,115,107, Deffeyes et al., U.S. Pat. No. 4,186,244, and Tyran U.S. Pat. No. 4,273,583 and U.S. Pat. No. 4,331,714 and UK No. 1,191,204 (assigned to Showa Aluminum Powder Co., Ltd.).

D. Organic Medium

The organic medium for use in the invention is comprised of an acrylic polymer having a comparatively low burn-out temperature dissolved in a primary solvent selected from ethylene glycol monobutyl ether acetate, dimethyl adipate and mixtures thereof.

Polymers which are suitable for use in the invention are acrylic polymers which are free of hydrogen bond-forming groups such as polar groups. In particular the acrylic polymer should be free of acid, amine and hydroxyl groups which have been found to affect rheology adversely. As used herein the term "acrylic" encompasses both acrylic and methacrylic groups. The latter are preferred for use in the invention.

Because quite rigorous rheological and adhesive properties must be met by the compositions of the invention, both the polymeric binder and the solvent compositions must be chosen with care. In particular, the primary solvent component of the organic medium has been found to be uniquely and surprisingly critical in that only ethylene glycol monobutyl ether acetate and dimethyl adipate have been found to yield both good rheology and good fired adhesion. Not only do nonanalogous solvents fail to give these properties, but, in the case of the glycol-based solvent, even analogous solvents, such as the Cellosolves and Cellosolve acetates by themselves fail also to give appropriate rheology and adhesion for use in attaching IC devices.

Though it is preferred to use the above-described primary solvents by themselves, it is nevertheless possible to use solvent mixtures containing up to 40% wt. (basis total solvent weight) of certain secondary solvents without significantly degrading the rheological properties of the compositions. Suitable secondary solvents have been found to include glycol monoethers, terpineol, 2,2,4-trimethyl-1,3-pentanediol monoisobutyrate, tridecyl acetate and mixtures thereof.

For many applications in which it is desired that the adhesive remain tacky for an extended time before the IC chip is put in place, it is preferred to use dimethyl adipate, which is less volatile than the glycol ether acetate.

E. Formulation

The adhesive compositions of the invention are concentrated dispersions of metal or metal-containing particles having paste consistency. These dispersions are "shear-thinning", that is, they are non-fluid and gel-like in consistency so long as the shear stress on them is less than the yield stress. Therefore, the compositions have a measurable yield point. In particular, it has been found that to avoid dripping during the application process the compositions should have a yield stress of at least 200 and preferably 500 dynes/cm. As used herein, the term "yield stress" refers to the viscosity of the composition as determined by extrapolation of the stress-viscosity correlation.

The viscoelastic response of the adhesive has been measured under both steady and oscillatory shear in order to define flow behavior during the different shear/time conditions of the application process: storage, filling, dispensing, pull off, pattern retention, and die attachment. The steady shear results show that the adhesive follows a power law response over four decades of shear rate, with a yield stress at the low shear limit. Time effects were characterized by thixotropic loop measurements or by monitoring the breakdown and build-up of paste viscosity under controlled shear history. In all cases, the adhesive exhibited rapid recovery of viscosity. Rapid structure build-up after high shear is facilitated by particle-to-particle interactions in a low viscosity, continuous phase. The power law shear thinning response, which is characteristic of the adhesive, combines a high viscosity at low shear rate, important in maintaining a stable dispersion, with the low viscosity at high shear rate, required for reproducible paste dispense from high speed application equipment. The shear thinning nature of the paste also prevents "string formation" during pulloff after dispensing.

Interparticle interactions promote formation of a three-dimensional, solid-like structure at low shear rate to provide long-term dispersion stability. Under moderate to high shear, the dispersion becomes a fluid which shear thins and dispenses readily for application. After dispensing, the paste structure recovers rapidly retaining the shape of the adhesive pattern. Experience with the compositions of the invention has shown that the most desirable pastes rheologically are those which have a consistency similar to mayonnaise which is not stringy and is easy to spread.

In summary, the rheological properties of the adhesive composition provide specific characteristics optimized for use on high speed automatic application equipment. The yield stress of the paste provides long-term dispersion stability. Rapid recovery of the yield stress following shear results in high resolution of the dispensed adhesive pattern and also prevents paste leakage from the dispenser. The strongly shear thinning response of the paste provides good flow during dispensing, prevents "string" formation and permits smooth squeeze flow of the adhesive as the die is placed.

F. Substrates

The compositions of the invention can be used to adhere virtually any inorganic surfaces which readily form oxides. However, the compositions of the invention are particularly effective in attaching silicon integrated circuit chips to substrates such as alumina, beryllia and aluminum nitrides. Either the substrates or the IC chips may in some instances be metallized with a thin layer of thermally conductive metal such as gold.

Test Procedures

1. Substrate Attach Strength

This important property is determined in accordance with Mil Spec 883 and is intended to determine the strength of the element attachment system when subjected to a tensile force. The test involves attaching an epoxy-coated stud to the mounted die surface and the assemblage is cured. After curing the epoxy resin, the assemblage is subjected to a vertical pull force of up to two times the specified minimum tensile strength, which value is a direct function of the die attachment area.

2. Volume Resistivity

Specimens are prepared on $1'' \times 3''$ ($2.5 \times 7.6$ cm) glass slides. A guide jig is used to place two strips of transparent tape 0.254 cm apart with their edges parallel to the long edge of the slide. The slides are washed with methanol and air dried. A drop of adhesive is placed at one end of the gap between the tape strips. The adhesive is squeegeed into the gap using a single edge razor blade held at an angle to the slide. The tape is removed and the samples are fired. Resistance is measured with a Gen Rad Digibridge 1657 RLC meter using single point probes in a plastic fixture designed to space the probes 2.54 cm apart. Thickness (cm) is measured on a light section microscope. Volume resistivity is given by the relationship $$\text{Volume Resistivity } (\Omega \cdot \text{cm}) = \frac{\text{Resistance} \times \text{Thickness} \times \text{Width}}{\text{Length}}$$

3. Contact Angle

The equilibrium shape assumed by a liquid drop placed on a smooth solid surface under the force of gravity is determined by the mechanical force equilibrium of three surface tensions $\gamma$ (LV) at the liquid-vapor interface; $\gamma$ (SL) at the liquid-solid interface; and $\gamma$ (SV) at the solid-vapor interface. The contact angle is in theory independent of the drop volume and in the absence of crystallization or interaction between the substrate and the test liquid depends only upon temperature and the nature of the respective solid, liquid and vapor phases in equilibrium. Contact angle measurements are an accurate method for characterizing the wettability of a solid surface since the tendency for the liquid to spread and "wet" the solids surface increases as the contact angle decreases.

4. Thermal Impedance

The thermal impedance (the reciprocal of thermoconductivity) of packages made with the compositions of the invention was measured using thermal chips according to Mil Spec 38510, Appendix C.

EXAMPLES

EXAMPLES 1-3

Adhesion

A series of three tests was performed to demonstrate the excellent adhesion properties of the invention composition. The compositions of the adhesive used in the tests were as follows

| Component | % Wt. |
| --- | --- |
| Surface treated flake silver[1] | 69 |
| Glass Frit A | 18 |
| 50/50 n-butyl methacrylate/ isobutyl methacrylate copolymer | 1 |
| Butyl Cellosolve Acetate | 12 |

[1] Metz, tradename of Degussa Metz Metallurgical Corp., S. Plainfield, NJ

Formulation

In the following examples, the adhesive composition was formulated by weighing the silver particles, glass frit, acrylic polymer binder solution and additional solvent into a plastic container and mixing them thoroughly to obtain a uniform consistency. Ten percent additional solvent (based on the original solvent) was added and mixed with the composition which was then roll milled 1×50 psi (3.5 kg/cm$^2$), and 3×100 psi (7.0 kg/cm$^2$), using a 2 mil feed gap and 2 mil (5.1×10$^{-3}$ cm) apron gap.

In Example 1, approximately 6 mils of paste (composition described above) was stenciled through a 117×169 mil opening onto a bare ceramic dual in-line package (CERDIP) carrier. A 117×169 mil gold-backed silicon die was placed by hand onto the paste using slight pressure to evenly distribute the paste, totally filling the space between the die and the ceramic carrier. The completed parts were then heated in a box oven according to the following schedule: 5° C. per minute to 180° C.; 20° C. per minute to 435° C. with a 10 minute hold period at the 435° C. peak temperature. The parts were then removed from the oven and allowed to cool to room temperature. Final thickness of the adhesive bond ranged from 3.5 to 4.2 mils. Adhesion of the twenty-five parts were tested using a SEBASTIAN I (The Quad Group, Santa Barbara, CA) stud pull adhesion tester according to Mil Spec 883. The average stud adhesion value was 4500 psi, with a low value of 3100 psi and a high value of 5600 psi. The minimum acceptable stud pull adhesion value for this die size is 380 psi.

In Example 2, parts were prepared using paste dispensed from a K&S automatic die bonding equipment. The parts were dried in an infrared belt oven using a 5° C. per minute heating ramp to 180° C. then fired in a belt furnace with a 50° C. per minute ramp to 415° C. with 10 minutes at peak temperature. The parts were then refired in a belt furnace with a 50° C. per minute ramp to 435° C. and held at a peak temperature of 439° C. for 10 minutes. The parts were examined by x-ray radiograph and showed no evidence of voids. The final adhesive bond thickness was 3.5 to 4.0 mils (89-102 microns). The average stud pull adhesion value was 5000 psi.

In Example 3, parts were prepared using a larger 250 mil by 250 mil gold-backed silicon die. Fifteen mg of paste was dispensed and the dies were placed using a Laurier syringe die bonder. Processing of the parts was as in Example I. Adhesion values for eight parts tested using the SEBASTIAN III (The Quad Group, Santa Barbara, CA) stud pull tester gave an average of 30 lbs, a low value of 21 lbs, and a high value of 40 lbs. Minimum Military specification for this die size is 7 lbs.

EXAMPLES 4 and 5

Thermal Resistance

High temperature durability and good thermal dissipation are required for adhesives used to attach high power IC devices to ceramic packages. The operating temperature of the IC device must be maintained below 150° C. to avoid electrical malfunction. The interface between the die and the package has a significant influence over thermal resistance values. Gold-silicon eutectic bonding process for die attach is difficult to control and is subject to voiding at the interface. One advantage of a silver-filled glass adhesive is the absence of voids at the interface due to the wettability of the interfaces by the glass.

The thermal impedance of the packages were measured using thermal chips according to Mil Spec 38510 Appendix C. 60 mil by 60 mil thermal dies were mounted using the paste (preferred composition described above) and cured as in Example 1 (adhesion testing). The thermal resistance measured for 4 samples of silver-filled glass adhesive gave a mean value of 17.7° C. per watt with a std deviation of 0.40 (Example 4). Test results from eight samples prepared with gold-silicon eutectic bonding gave a mean value of 14.6° C. per watt with a standard deviation of 0.95 (Example 5).

EXAMPLES 6-14

A series of nine paste compositions was prepared having the same composition as Examples 1-3 except that in Examples 7-14 a different solvent was used and the pastes were evaluated with respect to dispense rheology. By the term "dispense" rheology is meant the rheological properties which are essential to the low flow and high shear conditions encountered when the paste composition is dispensed to a surface from the small orifice of a syringe applicator having an internal diameter of 1.37- 0.25 mm. A spatula is dipped into a mass of the paste, pulled away from the paste surface and the behavior of the paste on the spatula and at the surface of the paste mass is observed. The rheology is evaluated qualitatively by the following criteria:

Good—Fluffy consistency, no stringing, no drip of paste from the spatula and only a short tail at the point of removal.

Fair—Heavier consistency, almost forms strings, no drip of paste from the spatula, but a substantial tail at the point of removal.

Poor—Lumpy consistency drips off the spatula and substantial stringing (very long tail) between the paste surfaces. Paste tends to be gummy.

As can be seen in the following table, only the compositions in which butyl Cellosolve acetate or dimethyl adipate were used as solvent had good dispense rheological characteristics.

TABLE 1

Effect of Solvent on Dispense Rheology

| Solvent Composition | Dispense Rheology |
| --- | --- |
| Butyl Cellosolve Acetate[1] | Good |
| Carbitol Acetate[2] | Poor |
| Dibutyl Carbitol[3] | Poor |
| Dowanol EPh[4] | Fair |

TABLE 1-continued

| Effect of Solvent on Dispense Rheology | |
|---|---|
| Solvent Composition | Dispense Rheology |
| 2-Ethyl Hexanol | Poor |
| Terpineol | Poor |
| Ethyl-3-ethoxypropionate | Poor |
| Texanol[5] | Fair |
| Dimethyl Adipate | Good |
| Tridecyl Acetate | Fair |
| Butyl Carbitol[6] | Fair |
| Butyl Carbitol Acetate[7] | Poor |
| Ethylene Glycol | Poor |
| Propylene Carbonate | Poor |

[1] Tradename of Union Carbide Company, New York, NY for ethylene glycol monoethylether acetate
[2] Tradename of Union Carbide Company, New York, NY for diethylene glycol monoethylether acetate
[3] Tradename of Union Carbide Company, New York, NY for diethylene glycol dibutylether
[4] Tradename of Dow Chemical Company, Midland, MI for glycol monoethers
[5] Tradename of Eastman Chemical Products, Inc., Rochester, NY for 2,2,4-trimethyl-1,3-pentanediol monoisobutyrate
[6] Tradename of Union Carbide Company, New York, NY for diethylene glycol monobutyl ether
[7] Tradename of Union Carbide Company, New York, NY for diethylene glycol monobutylether acetate.

EXAMPLES 15–18

A series of four further compositions was prepared having the same composition as Example 1 except that different particles were used. As can be seen in Table 2 below, only the surfactant-treated silver particles had satisfactory dispersion stability. The untreated silver powder (Q100) and the untreated silver-coated nickel flakes did not form stable dispersions but settled out too rapidly even to be evaluated.

TABLE 2

| Effect of Surfactant Coating on Silver Conductor | | |
|---|---|---|
| Description of Particles | Particle Shape | Dispersion Stability |
| Metz 15[1] | Flake | Good |
| Metz 26[2] | Flake | Fair |
| Q100[3] | Powder | Poor-Settled[4] |
| Silver-Coated Nickel | Flake | Poor-Settled[4] |

[1] 50% 3–4.5 microns particles, Metz 15, tradename of Degussa Metz Metallurgical Corp., S. Plainfield, NJ
[2] 50% 7.5–9 microns particles, Metz 26 tradename of Degussa Metz Metallurgical Corp., S. Plainfield, NJ
[3] 10 microns
[4] Electrical properties could not be tested.

Dispersion stability was evaluated qualitatively at room temperature according to the following criteria:
Good—No settling at 6 months
Fair—Some settling at 1 month
Poor—Settling after overnight storage.

EXAMPLES 19–33

A series of fifteen further tests was run in which the powdered glass frit of Example 1 was placed on gold and other suitable materials and sintered under various conditions to observe the wetting characteristics of the glass frit.

EXAMPLE 19

A powdered frit (milled in isopropanol to a surface area of about 1 m²/gm) was sprinkled on a gold-coated silicon die (substrate). The substrate was placed on a hot stage capable of heating the part to well above the softening point of the glass. Glass softening and wettability on the substrate were monitored using a videocamera. A thermcoupled embedded in the stage monitored temperature as a function of time with readout to a strip-chart recorder. No special control of the atmosphere was taken. The substrate was rapidly heated at a rate of 150° C./min to 400° C. and held at 400° C. for 5 minutes. The contact angle of the melted glass on the substrate was observed to be less than 30° (one value as low as 9°).

EXAMPLE 20

The same powdered frit and substrate were used as in Example 19 except the substrate was placed into a box furnace and held at 350° C. for 5 minutes. A contact angle of less than 30° was observed.

EXAMPLE 21

The contact angle was determined as in Example 19 using the same powdered frit, substrate, and heating rate except the peak temperature was increased from 400° C. to 425° C. In this case, the contact angle observed ranged from 60° to 79°. It is believed that a rapid increase in glass viscosity occurred as the glass crystallized at 425° C. which resulted in incomplete wetting of the substrate.

EXAMPLE 22

A piece of glass about 0.5 cm on edge of the same bulk composition described in Example 1 was crushed using a mortar and pestle to produce a powder. The powdered glass was placed on a smooth, gold-coated silicon die as in Example 19 and heated at a less rapid heating rate of 50° C. per minute to a peak temperature of 415° C.. The contact angle observed ranged from 40 to 65° C.. The sample was cooled to room temperature and then reheated at 50° C. per minute to 435° C. and held for 5 minutes. No change in the contact angle occurred once crystallization took place.

EXAMPLE 23

The same powdered frit and substrate as in Example 19 except the substrate was placed into a box furnace held at 450° C. for 5 minutes. The contact angle observed was 90°. Glass crystallization occurred prior to wetting of the substrate.

EXAMPLES 24–30

The powdered frit from Example 1 was lightly sintered for 10 minutes at 350° C. to form a white, friable pellet. The contact angle observed when heating this pellet at 150° C. per minute to 400° C. was greater than 90° for the following substrates: smooth goldcoated die (95°—adhesion); Al₂O₃ (115° to 165° adhesion); bare smooth silicon (155° to 170°—no adhesion); silver-coated alumina (135°—some adhesion); gold-coated alumina (129° to 135°—adhesion); pure gold foil (140° to 145°—no adhesion); and pure silver foil (161° to 164°—some adhesion).

EXAMPLE 31

A glass piece about 0.5 cm on a side of the same bulk composition described in Example 1 was placed on the gold-coated silicon substrate and heated at the less rapid rate described in Example 4. The glass softened at about 350° C. and formed a sphere with a contact angle of 115°. No change in contact angle was observed on reheating to 435° C. peak temperature. Heating a fresh sample to 435 peak temperature resulted in a contact angle of 128°. Examples 30 and 31 demonstrate the importance of using finely divided glass particles to get substrate wetting prior to glass crystallization.

EXAMPLE 32

The powdered frit from Example 1 was placed on a pure, smooth silicon chip. The substrate was rapidly heated at a rate of 150° C. per min to 400° C. and held at 400° C. for 5 minutes. The contact angle of the glass observed on pure silicon ranged from 30° to 46°.

EXAMPLE 33

The same powdered frit as in Example 1 was placed on pure silver foil. The substrate was rapidly heated at a rate of 115° C. per minute to 400° C.. The contact angle observed on pure silver ranged from 78° to 90°.

EXAMPLES 34–36

A further series of three tests was conducted in the same manner as Examples 1–3 except that the solvent component of the organic medium was a mixture, by weight, of 7.5 parts of dimethyl adipate, 3 parts of terpineol (a secondary solvent) and 1.5 parts of butyl Cellosolve acetate. The adhesion values all exceeded the requirements of 2X Mil.Std. 883C, Method 2027.

EXAMPLES 37 and 38

Two further tests were performed to compare the dispense properties of the bonding composition of the invention (Example 37) in which a dimethyl adipate solvent system was used and a conventional bonding system in which a terpineol solvent system was used (Example 38). Both compositions contained the same solids—a mixture of glass frit and silver particles—and were of paste consistency. The viscosity of the invention composition was 54.4 PaS and the viscosity of the comparative composition was 59.3 PaS. Both viscosity values were well within the specification viscosity range of 53–72 PaS for such pastes.

Each of the pastes were then applied to an alumina substrate in identical quantities and manner in the form of a symmetrical pattern of three rows of three paste drops by means of a multi-needle dispense nozzle equipped with 21 gauge needles spaced 1.9 mm apart. The dispensing nozzle was placed 4 mm above the substrate as the paste was dispensed onto the substrate. After application to the substrate, the patterns of paste drops were dried at 70° C. for two hours.

Figure 2:
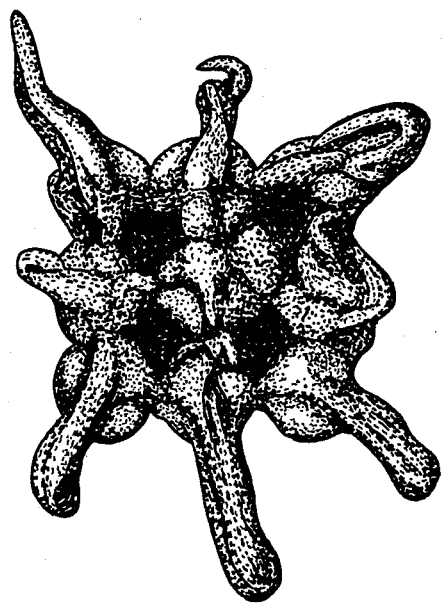
FIG. 2 is a pictorial elevation view of the bonding composition of the invention in the same dispense test pattern using a dimethyl adipate solvent system.

The paste of the invention containing dimethyl adipate as the organic medium gave discrete cone-shaped drops without any dripping or tailing. None of the drops flowed into any of the adjacent drops. (See FIG. 2 of the Drawing). On the other hand, the paste containing terpineol as organic medium incurred substantial tailing and flow of the paste among the bits, which would render it unsuitable for die attachment. (See FIG. 1 of the Drawing.)

EXAMPLES 39–47

A series of four lead-boron frits was prepared having the following compositions:

| Glass Dispersion Composition, % wt. | E | F | G | H |
| --- | --- | --- | --- | --- |
| PbO | 78.5 | 95.0 | 95.0 | 82.9 |
| $B_2O_3$ | 11.1 | 4.75 | 4.0 | 17.1 |
| $SiO_2$ | — | 0.25 | 1.0 | — |

| Glass Dispersion Composition, % wt. | E | F | G | H |
| --- | --- | --- | --- | --- |
| ZnO | 10.4 | — | — | — |

Separate quantities of each of these glasses were then aqueously or non-aqueously milled and the quantities were each mixed with finely divided silver particle and organic medium to form a thick film paste. The pastes all had the same composition except for the different composition of the glass frits. The composition by weight of the eight pastes was as follows:

| | |
| --- | --- |
| 18.35% | Frit |
| 3.63 | Acrylic polymer dissolved in butyl Cellosolve acetate (30/70) |
| 9.62 | Solvent (40/60 solution of terpineol and dimethyl adipate) |
| 68.40 | Silver particles |

The rheological behavior of the above-described pastes is given in the following table:

| Example No. | 39 | 40 | 41 | 42 |
| --- | --- | --- | --- | --- |
| Glass | E | E | E | F |
| Suspending Medium | $H_2O$ | Air | IPA[1] | $H_2O$ |
| Milling Method | | | | |
| Ball Mill | x | | x | x |
| Air Jet | | x | | |

| Example No. | 43 | 44 | 45 | 46 | 47 |
| --- | --- | --- | --- | --- | --- |
| Glass | F | G | G | H | H |
| Suspending Medium | IPA | $H_2O$ | IPA | $H_2O$ | IPA |
| Milling Method | | | | | |
| Ball Mill | x | x | x | x | x |
| Air Jet | | | | | |

[1] IPA denotes isopropanol.

All of the pastes which used frits that had been ball milled in water had rheological deficiencies. The paste of Example 39 was stringy and resistant to flow and pastes 42 and 44 formed a hard cake upon standing overnight. On the other hand, none of the pastes which used frit that had been milled in isopropanol exhibited any tendency to form strings and were readily flowable. Furthermore, when the pastes of Examples 46 and 47 were allowed to stand for twelve days, it was found that the paste containing the water-milled frit (Example 46) underwent a viscosity increase of 23.1%, while the paste containing the non-aqueous milled frit (Example 47) underwent a viscosity increase of only 7.2%. Thus, pastes formulated from the non-aqueously milled glass frits exhibited much greater viscosity stability. The relative stability of the pastes of Examples 46 and 47 is shown in the following table:

TABLE 4

| | Viscosity Stability of Pastes | | | | |
| --- | --- | --- | --- | --- | --- |
| Time (days) | 0 | 1 | 7 | 12 | 53 |
| Viscosity, PaS | | | | | |
| Example 46 | 64 | 68 | 70.3 | 78.8 | 95 |
| Example 47 | 58.4 | 58.8 | 59.4 | 62.6 | 76.8 |

EXAMPLES 47 and 48

The following examples illustrate the adverse effect of using too large silver particles.

Two compositions were formulated in the same manner as EXAMPLE 1 using two commercially available flaked silvers Metz 26, containing 50% 7.5–9 micron particles, and a 70/30 by wt. blend of Metz 26 and Metz 15, the latter of which contained 50% 3–4.5 micron particles. In both instances the adhesion and rheology were adversely affected. Because, the paste lost its yield stress and became very "runny", it was therefore unsuitable for high speed automated bonding.

EXAMPLE 49

In the following example a composition is prepared having the same composition as EXAMPLE 1 except that the acrylic polymer of EXAMPLE 1 which contained no functional groups was replaced by one containing 0.1% by weight methacrylic acid. Composition of the resin was 62.3/37.1/0.6 ethyl methacrylate/methyl acrylate/methacrylic acid. Upon completion of the formulations the composition had excellent adhesion but had unsuitable rheology in that it was very stringy.

We claim:

1. A composition which is useful for bonding integrated circuits to inorganic dielectric substrates comprising an admixture of
  a. finely divided particles of metal and/or metal containing compound having a thermal conductivity of at least 0.2 $Wcm^{-1}K^{-1}$ at 298 K at least 90% of the metal particles having a maximum dimension of less than 15 $\mu m$;
  b. finely divided particles of a non-aqueously milled crystallizable amorphous glass frit which (1) has a DTA softening point of 300°–400° C., (2) has a contact angle with gold of no more than 60° when measured at a peak temperature of 400° C., and (3) is substantially free of alkali metal and halogen ions, the volume ratio of a. to b. being from 0.75 to 5.0;
  c. 0.2–2% weight of a surfactant selected from long chain carboxylic acids, alkyl esters of long chain carboxylic acids, and mixtures thereof, a., b., and c. being dispersed in
  d. organic medium comprising a solution of
    (1) acrylic polymer free of polar functional groups dissolved in
    (2) a solvent consisting essentially of (a) 60–100% wt. of a primary solvent selected from ethylene glycol monobutyl ether acetate, dimethyl adipate and mixtures thereof and (b) 40–0% wt. of a secondary solvent selected from glycol monoethers, terpineol, 2,2,4-trimethyl-1,2-pentanediol monoisobutyrate, tridecyl acetate and mixtures thereof, the total composition containing 0.5—5% wt. acrylic polymer, the composition having a yield stress of at least 200 dynes/cm.

2. The composition of claim 1 in which the frit is a crystallizable glass which upon firing at 350°–500° C. forms at least one crystalline phase dispersed in a matrix of remainder glass.

3. The composition of claim 1 in which the metal is surface-treated silver.

4. The composition of claim 1 in which the frit is a lead zinc borate glass.

5. The composition of claim 4 in which the lead zinc borate glass is a crystallizable glass which consists by weight of 78.5% PbO, 10.4% ZnO and 11.1% $B_2O_3$.

6. The composition of claim 1 in which the glass is noncrystallizable between 350°–500° C. and consists essentially by weight of 78.5% PbO, 10.4% ZnO, 7.1% $B_2O_3$ and 4.0% $SiO_2$.

7. The composition of claim 1 in which the surfactant is coated on the surface of the metal and/or metal-containing compound.

8. The composition of claim 1 in which the surfactant is dissolved in the organic medium.

9. The composition of claim 1 in which the surfactant is a long chain fatty acid.

10. The composition of claim 9 in which the surfactant is a $C_{10-30}$ fatty acid.

11. The composition of claim 10 in which the fatty acid is stearic acid.

12. The composition of claim 10 in which the fatty acid is oleic acid.

13. The composition of claim 1 in which the glass frit was ball milled.

14. The composition of claim 13 in which the glass frit was milled in isopropanol.

15. The composition of claim 1 in which the glass frit was air jet milled.

* * * * *